United States Patent
Lu et al.

(10) Patent No.: US 11,289,611 B2
(45) Date of Patent: Mar. 29, 2022

(54) THREE DIMENSIONAL MEMORY

(71) Applicant: Micron Technology, Inc., Boise, ID (US)

(72) Inventors: Zhenyu Lu, Boise, ID (US); Hongbin Zhu, Boise, ID (US); Gordon A. Haller, Boise, ID (US); Roger W. Lindsay, Boise, ID (US); Andrew Bicksler, Nampa, ID (US); Brian J. Cleereman, Boise, ID (US); Minsoo Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 133 days.

(21) Appl. No.: 16/845,793

(22) Filed: Apr. 10, 2020

(65) Prior Publication Data

US 2020/0243677 A1 Jul. 30, 2020

Related U.S. Application Data

(62) Division of application No. 13/716,287, filed on Dec. 17, 2012, now Pat. No. 10,651,315.

(51) Int. Cl.
*H01L 29/788* (2006.01)
*H01L 23/535* (2006.01)
(Continued)

(52) U.S. Cl.
CPC ...... *H01L 29/788* (2013.01); *H01L 21/28518* (2013.01); *H01L 23/535* (2013.01);
(Continued)

(58) Field of Classification Search
CPC .......... H01L 27/11517–11582; H01L 29/7926; H01L 29/7889; H01L 29/7827;
(Continued)

(56) References Cited

U.S. PATENT DOCUMENTS 5,057,895 A  10/1991 Beasom
5,094,712 A  3/1992 Becker et al.
(Continued)

FOREIGN PATENT DOCUMENTS

KR  10-2010-0053393  5/2010
KR  10-2010-0097459  9/2010
(Continued)

OTHER PUBLICATIONS

WO PCT/US2013/047002 Search Rept., dated Oct. 18, 2013, Intel Corporation et al.
(Continued)

*Primary Examiner* — John A Bodnar
(74) *Attorney, Agent, or Firm* — Wells St. John P.S.

(57) ABSTRACT

A method to fabricate a three dimensional memory structure may include creating a stack of layers including a conductive source layer, a first insulating layer, a select gate source layer, and a second insulating layer, and an array stack. A hole through the stack of layers may then be created using the conductive source layer as a stop-etch layer. The source material may have an etch rate no faster than 33% as fast as an etch rate of the insulating material for the etch process used to create the hole. A pillar of semiconductor material may then fill the hole, so that the pillar of semiconductor material is in electrical contact with the conductive source layer.

11 Claims, 4 Drawing Sheets

(51) Int. Cl.
*H01L 21/285* (2006.01)
*H01L 29/792* (2006.01)
*H01L 27/11582* (2017.01)
*H01L 27/1157* (2017.01)
*H01L 27/11556* (2017.01)
*H01L 27/11524* (2017.01)
*H01L 29/66* (2006.01)

(52) U.S. Cl.
CPC .... *H01L 27/1157* (2013.01); *H01L 27/11524* (2013.01); *H01L 27/11556* (2013.01); *H01L 27/11582* (2013.01); *H01L 29/66825* (2013.01); *H01L 29/66833* (2013.01); *H01L 29/7889* (2013.01); *H01L 29/792* (2013.01); *H01L 29/7926* (2013.01)

(58) Field of Classification Search
CPC ......... H01L 29/66666; H01L 29/78642; H01L 27/0688; H01L 21/8221; H01L 45/1233; G11C 5/025; G11C 2213/79; G06F 17/5068; G06F 11/1068; G06F 11/1666
See application file for complete search history.

(56) References Cited

U.S. PATENT DOCUMENTS

| | | | |
|---|---|---|---|
| 8,344,385 | B2 | 1/2013 | Kim et al. |
| 8,404,548 | B2 | 3/2013 | Park et al. |
| 2001/0019890 | A1 | 9/2001 | Arakawa |
| 2009/0242966 | A1 | 10/2009 | Son et al. |
| 2010/0117143 | A1 | 5/2010 | Lee et al. |
| 2010/0133598 | A1 | 6/2010 | Chae et al. |
| 2010/0159657 | A1 | 6/2010 | Arai et al. |
| 2010/0207240 | A1 | 8/2010 | Hashimoto et al. |
| 2011/0002178 | A1 | 1/2011 | Hwang et al. |
| 2011/0298038 | A1 | 12/2011 | Son et al. |
| 2011/0303971 | A1 | 12/2011 | Lee et al. |
| 2012/0008400 | A1 | 1/2012 | Fukuzumi et al. |
| 2012/0068242 | A1 | 3/2012 | Shin et al. |
| 2012/0098051 | A1 | 4/2012 | Son et al. |
| 2012/0241842 | A1 | 9/2012 | Matsuda |
| 2013/0044531 | A1 | 2/2013 | Baek et al. |
| 2013/0175494 | A1 | 7/2013 | Collins et al. |
| 2014/0003148 | A1 | 1/2014 | Sun et al. |
| 2014/0029352 | A1 | 1/2014 | Tanzawa |
| 2014/0061779 | A1 | 3/2014 | Kim et al. |

FOREIGN PATENT DOCUMENTS

| | | |
|---|---|---|
| KR | 10-2011-0034816 | 4/2011 |
| KR | 10-2012-0029291 | 3/2012 |

OTHER PUBLICATIONS

WO PCT/US2013/047002 Writ. Opin., dated Oct. 18, 2013, Intel Corporation et al.
Fracassi et al., "Plasma Assisted Dry Etching of Cobalt Silicide for Microelectronics Applications", Journal of the Electrochemical Society vol. 143, No. 2, Feb. 1996, United States, pp. 701-707.
U.S. Appl. No. 13/786,925 Office Action dated Mar. 27, 2014.
Williams et al., "Etch Rates for Micromachining Processing—Part II", IEEE Journal of Microelectromechanical Systems vol. 12, No. 6, Dec. 2003, United States, pp. 761-778.

THREE DIMENSIONAL MEMORY

RELATED PATENT DATA

This application is a divisional of and claims priority to U.S. patent application Ser. No. 13/716,287 filed on Dec. 17, 2012, and which is incorporated by reference herein.

BACKGROUND

The present subject matter relates to semiconductor memories, and more specifically, to three-dimensional NAND flash memory arrays.

Many types of semiconductor memory are known. Some memory is volatile and will lose its contents if power is removed. Some memory is non-volatile and will hold the information stored in the memory even after power has been removed. One type of non-volatile memory is flash memory which stores charge in a charge storage region of a memory cell. In a floating gate flash cell, a conductive floating gate, positioned between the control gate and the channel of a metal-oxide silicon field effect transistor (MOSFET), is used to store a charge. In a charge trap flash (CTF) cell, a layer of non-conductive material, such as a nitride film, is used to store charge between the control gate and the channel of a MOSFET. The threshold voltage of the MOSFET-based flash cell can be changed by changing the amount of charge stored in the charge storage region of the cell, and the threshold voltage can be used to indicate a value that is stored in the flash cell.

One architecture in common use for flash memories is a NAND flash architecture. In a NAND flash architecture, two or more flash cells are coupled together, source to drain, into a string, with the individual cell control gates coupled to control lines, such as word lines. Select gates, which may be standard MOSFETs, may be coupled to the NAND string at either end, to couple the NAND string to a source line at one end of the NAND string, and to a bit line at the other end of the NAND string.

Some NAND flash devices may create stacks of flash memory cells in a three-dimensional array of NAND strings. A stack of flash cells may include any number of flash cells with the source, channel, and drain arranged vertically so that as the cells are positioned, one on top of the other, they form a vertical NAND string. The vertical NAND string may be positioned on top of a select gate that may couple the string to a source line and may have another select gate positioned on top of the vertical NAND string to couple the string to a bit line.

BRIEF DESCRIPTION OF THE DRAWINGS

The accompanying drawings, which are incorporated in and constitute part of the specification, illustrate various embodiments. Together with the general description, the drawings serve to explain various principles. In the drawings.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures and components have been described at a relatively high-level, without detail, in order to avoid unnecessarily obscuring aspects of the present concepts. A number of descriptive terms and phrases are used in describing the various embodiments of this disclosure. These descriptive terms and phrases are used to convey a generally agreed upon meaning to those skilled in the art unless a different definition is given in this specification. Reference now is made in detail to the examples illustrated in the accompanying drawings and discussed below.

Figure 1:
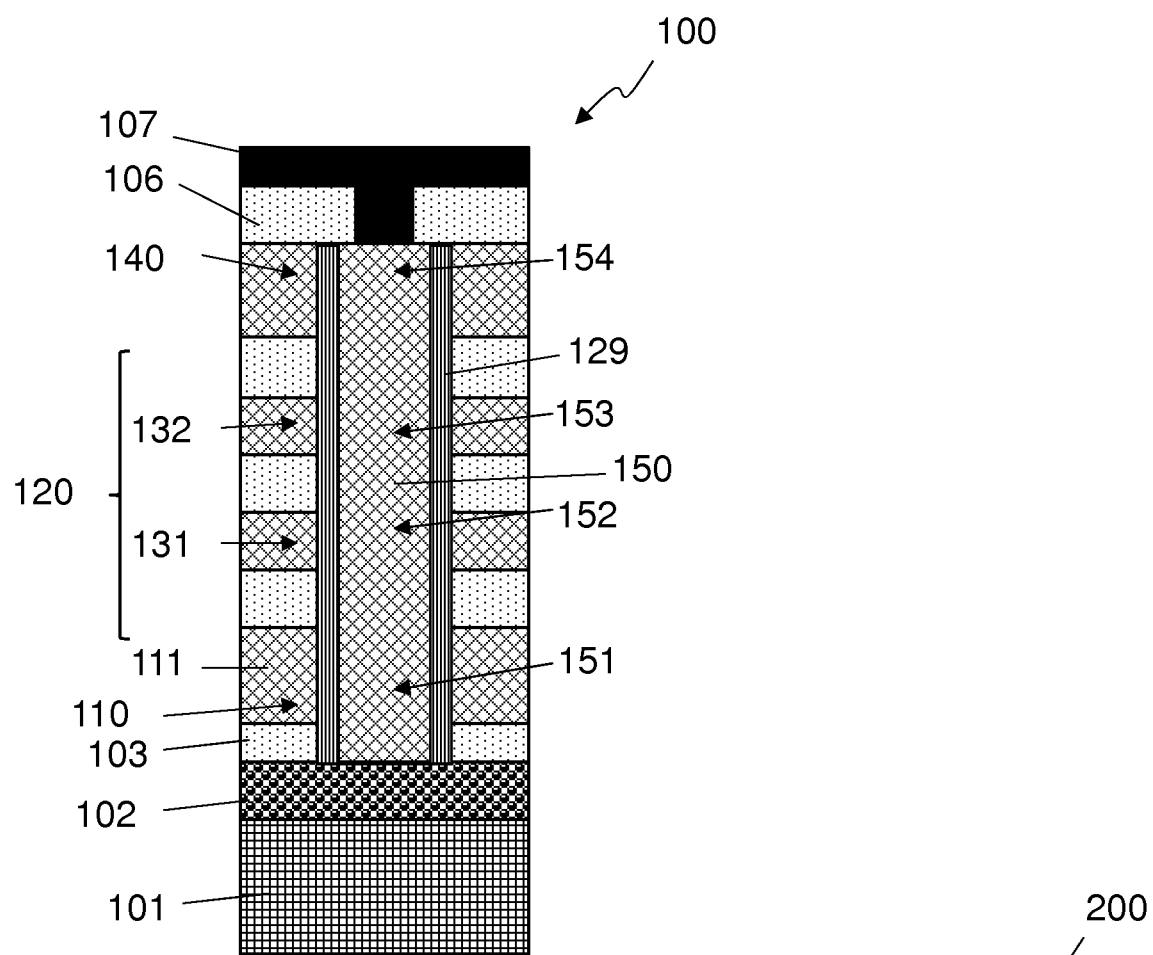
FIG. 1 shows a cross-sectional side view of an embodiment of a three dimensional NAND flash with a metallic silicide source.
Figure 2:
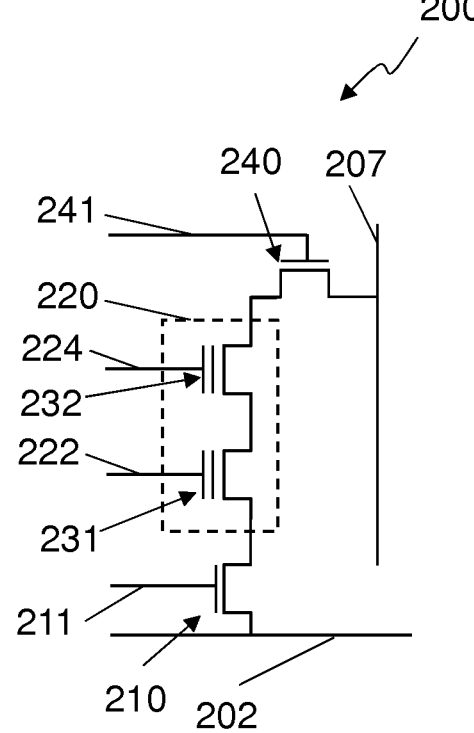
FIG. 2 shows a schematic of the three dimensional NAND flash of FIG. 1.

FIG. 1 shows a cross-sectional side view of an embodiment of a three dimensional NAND flash 100 with a metallic silicide source line 102. While the physical orientation of the three dimensional NAND flash 100 may change with respect to gravity, for the purposes of this disclosure and associated claims, a direction toward the plane of the substrate 101, which is perpendicular to the bottom of the page of the drawings in FIG. 1, is deemed to be down. So the view of FIG. 1 is from the side, and if a layer shown in FIG. 1, such as bit line layer 107, is farther from the bottom of the page than another layer, such as source layer 102, that layer, bit line layer 107 in this example, is above the other layer, such as source layer 102. FIG. 2 shows a schematic of the three dimensional NAND flash 200 with a metallic silicide source line 202 corresponding to source line 102 of FIG. 1. The two figures are discussed concurrently as they are different representations of a common apparatus, although FIG. 2 uses different reference numbers as a schematic is a more abstract representation that may not exactly match the physical elements represented in FIG. 1. The three dimensional NAND flash 100 may be a part of an integrated circuit, such as a NAND flash memory device, a processor, or some other type of integrated circuit.

The three dimensional NAND flash 100 may be fabricated on a substrate 101, which may be a silicon wafer in some embodiments. The substrate 101 may have various layers, films, patterned areas, doped areas, or other material below the conductive source layer 102 so the substrate 101 may refer to more than simply a raw wafer. Conductive source layer 102 may be used as a source line 202 of a memory array. The conductive source layer 102 may be made of a source line material that is conductive and may be used as an etch stop. A hole may have been formed for the pillar 150 of semiconductor material during fabrication the extends through the various layers to the source layer 102. To help accomplish this, the source material may have a slower etch rate than other layers. In one embodiment, the source line material may have an etch rate no faster than about 33% as fast as an etch rate of the insulating material used in the insulating layer 103 for an etch process used to form the hole. In other embodiments, the materials in the various layers, including the insulating layer 103, may have an etch rate that is 5, 10 or more times faster than the source material.

In various embodiments, the source line material may be any type of material that is conductive and may be used as an etch stop, including, but not limited to, a metallic silicide, such as tungsten silicide ($WSi_x$) or other metal-silicon compound. Various formulations of tungsten silicide may be used with any atomic ratio of tungsten to silicon, but in some embodiments, the tungsten silicide may have an atomic ratio of between 1 and 10 atoms of silicon per atom of tungsten. In at least one embodiment, the conductive source layer 102 may be made with tungsten silicide having an atomic ratio of about 3 atoms of silicon per atom of tungsten, such as between about 2.5 and about 3.5. The material of the source layer may be heavily doped in some embodiments, with at least one embodiment doped with arsenic (As) or phosphorus (P) to a level between about $10^{20}$ atoms per cubic centimeter ($cm^3$) and about $10^{21}$ atoms per $cm^3$.

A select gate source (SGS) metal-oxide field effect transistor (MOSFET, or simply FET) 110, which may be represented by FET 210 in FIG. 2, may be fabricated to couple to the conductive source layer 102. The SGS FET 110 may include a control gate fabricated in a conductive select gate source layer 111, which may be made of any conductive material, but may be made with heavily doped polysilicon in some embodiments. In at least one embodiment, the select gate source layer 111 may be P-doped. A source control line 211 may couple to the control gate of the SGS FET 110, 210 in the conductive select gate source layer 111. The select gate source layer 111, which may include the control gate of the SGS FET 110, may be isolated from the conductive source layer 102 by a first insulating layer 103 which may be made of any insulating material, but in some embodiments, may be an oxide or a nitride such as silicon oxide ($SiO_2$). One or more films 129 may form a gate dielectric, which may be $SiO_2$ in some embodiments, positioned between material of the select gate source layer 111 and a pillar of semiconductor material 150, which may be used as the channel 151 of the SGS FET 110 and may also function as the source of SGS FET 110 below the channel 151 and the drain of the SGS FET 110 above the channel 151.

The pillar 150 may be any suitable semiconductor material, including, but not limited to, silicon, polysilicon, doped polysilicon, gallium-arsenide (GaAs), or other semiconducting material. The pillar 150 may be a single monolithic pillar of semiconductor material in various embodiments, without any interfaces, seams, or large defects between the various channels 151-154 within the pillar 150. The pillar 150 may be created in its entire length by one fabrication process in some embodiments, so that the pillar 150 is relatively uniform in composition throughout its length. The pillar 150 may extend from the source layer 102 in a substantially perpendicular direction, although the angle formed between the pillar 150 and the source layer 102 may not be exactly 90° in every embodiment. The pillar 150, in some embodiments, may be an ohmic contact with the conductive source layer 102, although other embodiments may exhibit some level of non-linearity in the junction between the source layer 102 and the pillar 150. The pillar 150 may be tapered, or it may have a relatively constant diameter throughout its height depending on the embodiment. In other embodiments, the pillar 150 may have an irregular diameter, being wider at some layers and narrower at others. The pillar 150 may be roughly circular in cross-section, although other embodiments may have an oval, polygonal, or any other shape cross-section.

A stack of memory cells 120 may be formed on top of the SGS FET 110. The stack of memory cells 120 may be formed vertically, meaning that one memory cell 132 is above another memory cell 131, for a stack of two memory cells. Any number of memory cells may be included in the stack of memory cells 120, which may be shown as the NAND string 220 of FIG. 2. Some embodiments may include $2^n$ memory cells, such as 4, 8, 16, 32 or 64 memory cells in a vertical NAND string. Other embodiments may include a number of memory cells in the NAND string that is not a power of two, and may include memory cells for error correction codes, redundancy, or other purposes. For embodiments with more than two memory cells in the stack of memory cells 120, the vertical orientation of the stack may be interpreted as the second cell being positioned above the first cell, the third cell being positioned above the second cell, and the fourth cell being positioned above the third cell, with additional cells being positioned similarly above the other cells. In some embodiments, the cells may not be positioned exactly one on top of the other, as there may be some times where the various layers may be of different sizes or somewhat off-center from each other, but the cells of the stack of memory cells 120 use the pillar of semiconductor material 150 to form their channels.

In some embodiments, the memory cells may be formed using field effect transistors (FETs) 231, 232 having a charge storage mechanism located between a control gate and the channel. The charge storage mechanism may be a conductive floating gate, as may be used in floating gate flash memory, or a charge trapping layer, as may be used in a charge trap flash (CTF) memory, which may also be referred to as a silicon-oxide-nitride-oxide-silicon (SONOS) memory. Either mechanism, or some other mechanism, may be used for embodiments, and is represented generically by the one or more films 129. The one or more films 129 may also function as a gate dielectric for the FETs 231, 232, and may include one or more layers of various materials that may be patterned or unpatterned, such as, but not limited to, $SiO_2$ or other oxides, polysilicon, silicon nitride (SiN) or other nitrides, various metals or metallic compounds, or any other suitable material. The composition of the one or more films 129 may vary between regions of the 3D NAND flash 100 so that the gate dielectric of the FETs, 110, 140 may be different than the charge storage regions of the memory cells 131, 132. The one or more films 129 may have a non-uniform thickness and may be very thin or non-existent in some places. In some embodiments, the one or more films 129 may be recessed between the insulating layers with the conductive layers etched back further than the insulating layers creating annular rings of the one or more films 129.

The stack of memory cells 120 may include various layers of material. In the embodiment shown, the stack of memory cells 120 includes alternating insulating layers and conductive layers. If more memory cells are included in the stack 120, more layers may be included in the stack 120. Other layers and/or films may be included in some embodiments. The first flash cell 231 of the schematic of FIG. 2 may correspond to the flash cell 131 of FIG. 1 and the second flash cell 232 of FIG. 2 may correspond to the flash cell 132 of FIG. 1. A first word line 222 of FIG. 2 may be formed in one of the conductive layers, along with a control gate for the flash cell 131, 231, and a second word line 224 of FIG. 2 may be formed in another conductive layer, along with a control gate for the flash cell 132, 232. The insulating layers may be made with any type of insulating material, but may be made with $SiO_2$ in at least one embodiment. The conductive layers of the stack 120 may be made of any type of conductive material but may be made with doped polysilicon in some embodiments and may be n-doped in at least one embodiment.

The channels of the flash cells 131, 132 may be formed in the pillar of semiconductor material 150 with the pillar 150 also coupling the source layer 102 and drain layer 107 for the flash cells 131, 132 to form a NAND string of flash cells. The source of the first flash cell 131 may couple to the drain of the select gate source FET 110 in the pillar 150 without a discontinuity between the channel 151 of the select gate source FET 110 and the channel 152 of the first flash cell 131. Similarly, the flash cells 131, 132 of the NAND string 120 may have their channels 152, 153 coupled together through the pillar 150 without a discontinuity. By using a pillar of semiconductor material for the channels without a discontinuity between the FETs, defects may have less impact on the current flow through the NAND string and there may be a lower voltage loss through the NAND string as it is conducting. Another parameter that may help decrease the impact of defects on the current flow through the NAND string is decreased dimensional offset. If the offset between layers is reduced, the dimensional offset may be decreased. Likewise, if the dimensional change between layers is reduced, the dimensional offset may be decreased. Some embodiments may have other material in the channel areas of the select gate source FET 110 and/or the flash cells 131, 132, such as inter-poly dielectric films that are not a part of the pillar of semiconductor material 150, but as long as a part of the conductive channel of an activated switching device, such as select gate source FET 110 and/or the flash cells 131, 132, is in the pillar of semiconductor material 150, the channel may be deemed as being formed in the pillar of semiconductor material 150.

In some embodiments a select gate drain (SGD) FET 140, which may be represented by FET 240 in FIG. 2, may be fabricated on top of the stack of memory cells 120. The SGD FET 140 may include a control gate fabricated in a conductive layer which may be made of any conductive material, but may be a p-doped polysilicon in at least one embodiment. A source control line 241 may couple to the control gate of the SGD FET 140, 240 in the conductive layer. The conductive layer 140 may be isolated from the bit line layer 107 by one or more insulating layers 106 which may be made of any insulating material, but in at least some embodiments, may be made of a nitride or a carbon-based material. The one of more films 129 may act as a gate dielectric and separate the conductive layer from the pillar of semiconductor material 150, which may be used as the channel 154 of the SGD FET 140. The pillar 150 may also function as the source of SGD FET 140 below the channel 154 and the drain of the SGD FET 140 above the channel 154 in some embodiments. In some embodiments, the channel 154 of the SGD FET 140 may be coupled to the channel 153 of the top flash cell 132 of the stack of memory cells 120 within the pillar 150 without a discontinuity. The drain of the SGD FET 140, 240 may be coupled to a bit line 207 fabricated in the bit line layer 107.

Figure 3:
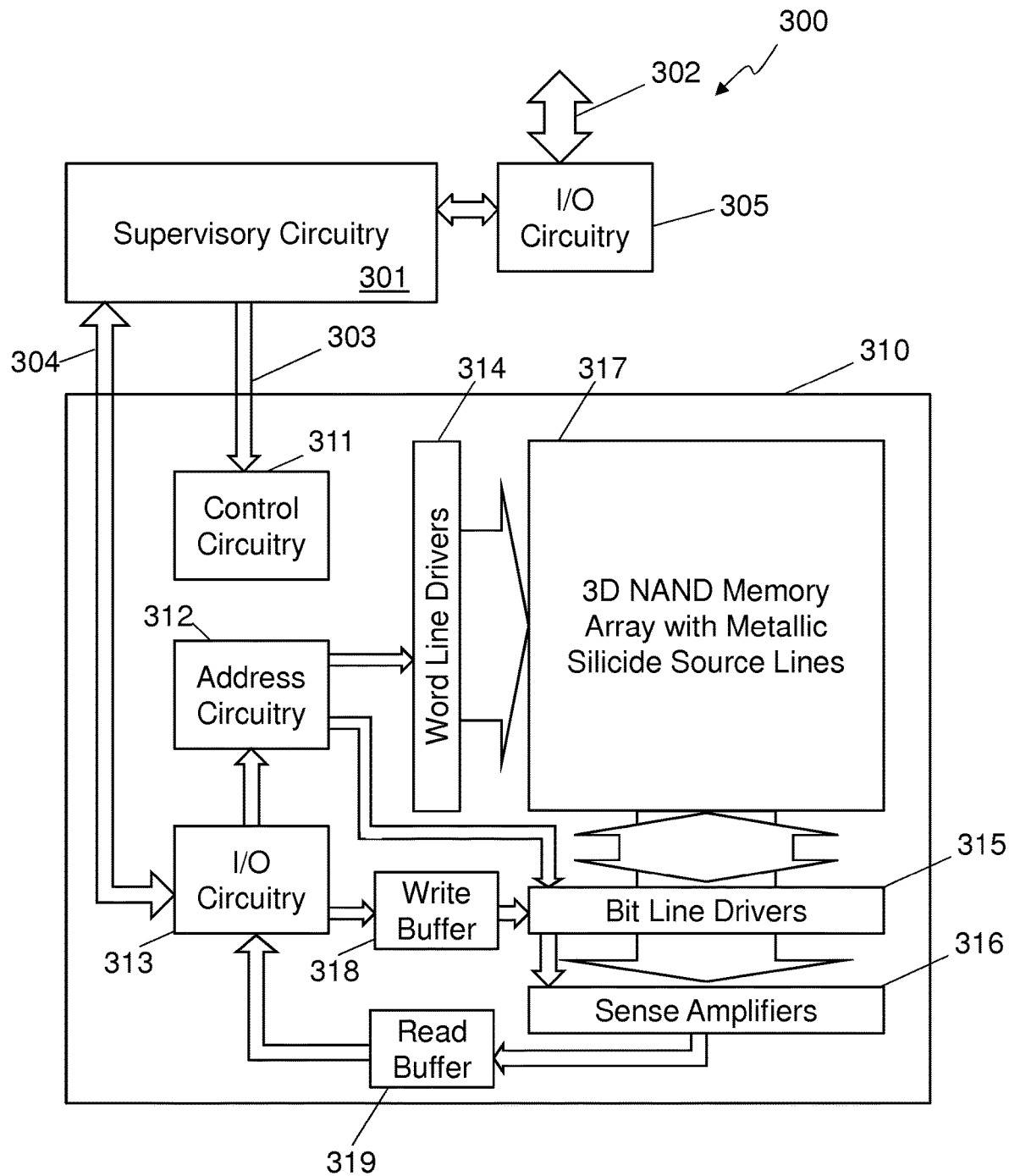
FIG. 3 is a block diagram of an embodiment of an electronic system using a three dimensional NAND flash with a metallic silicide source.

FIG. 3 is a block diagram of an embodiment of an electronic system 300 with memory 310 using three dimensional NAND flash memory with metallic silicide source lines. Supervisory circuitry 301 is coupled to the memory device 310 with control/address lines 303 and data lines 304. In some embodiments, data and control may utilize the same lines. The supervisory circuitry 301 may include a processor, microprocessor, microcontroller, finite state machine, or some other type of controlling circuitry. The supervisory circuitry 301 may execute instructions of a program in some embodiments. In some embodiments, the supervisory circuitry 301 may be integrated in the same package or even on the same die as the memory device 310. In some embodiments, the supervisory circuitry 301 may be integrated with the control circuitry 311, allowing some of the same circuitry to be used for both functions. The supervisory circuitry 301 may have external memory, such as random access memory (RAM) and read only memory (ROM), used for program storage and intermediate data or it may have internal RAM or ROM. In some embodiments, the supervisory circuitry 301 may use the memory device 310 for program or data storage. A program running on the supervisory circuitry 301 may implement many different functions including, but not limited to, an operating system, a file system, memory block remapping, and error management.

In some embodiments an external connection 302 is provided. The external connection 302 is coupled to input/output (I/O) circuitry 305 which may then be coupled to the supervisory circuitry 301 and allows the supervisory circuitry 301 to communicate to external devices. In some embodiments, the I/O circuitry 305 may be integrated with the supervisory circuitry 301 so that the external connection 302 is directly coupled to the supervisory circuitry 301. If the electronic system 300 is a storage system, the external connection 302 may be used to provide an external device with non-volatile storage. The electronic system 300 may be a solid-state drive (SSD), a USB thumb drive, a secure digital card (SD Card), or any other type of storage system. The external connection 302 may be used to connect to a computer or other intelligent device such as a cell phone or digital camera using a standard or proprietary communication protocol. Examples of computer communication protocols that the external connection 302 may be compatible with include, but are not limited to, any version of the following protocols: Universal Serial Bus (USB), Serial Advanced Technology Attachment (SATA), Small Computer System Interconnect (SCSI), Fibre Channel, Parallel Advanced Technology Attachment (PATA), Integrated Drive Electronics (IDE), Ethernet, IEEE-1394, Secure Digital Card interface (SD Card), Compact Flash interface, Memory Stick interface, Peripheral Component Interconnect (PCI) or PCI Express (PCI-e).

If the electronic system 300 is a computing system, such as a mobile telephone, a tablet, a notebook computer, a set-top box, or some other type of computing system, the external connection 302 may be a network connection such as, but not limited to, any version of the following protocols: Institute of Electrical and Electronic Engineers (IEEE) 802.3, IEEE 802.11, Data Over Cable Service Interface Specification (DOCSIS), digital television standards such as Digital Video Broadcasting (DVB)-Terrestrial, DVB-Cable, and Advanced Television Committee Standard (ATSC), and mobile telephone communication protocols such as Global System for Mobile Communication (GSM), protocols based on code division multiple access (CDMA) such as CDMA2000, and Long Term Evolution (LTE).

The memory device 310 may include an array 317 of memory cells. The memory cells may be organized into three dimensional stacks of memory cells, such as vertical NAND strings. The vertical NAND strings may be coupled to source lines made with a metallic silicide or other material as shown in FIG. 1 and described above. Address lines and control lines 303 may be received and decoded by control circuitry 311, I/O circuitry 313 and address circuitry 312 which may provide control to the memory array 317. I/O circuitry 313 may couple to the data lines 304 allowing data to be received from and sent to the processor 301. Data read from the memory array 317 may be temporarily stored in read buffers 319. Data to be written to the memory array 317 may be temporarily stored in write buffers 318 before being transferred to the memory array 317.

The system illustrated in FIG. 3 has been simplified to facilitate a basic understanding of the features of the memory. Many different embodiments are possible including using a solid state drive controller as the supervisory circuitry 301 and I/O circuitry 305 to control a plurality of memory devices 310 to act as a solid state drive. Another embodiment may use a processor for the supervisory circuitry 301 and I/O circuitry 305 with additional functions, such as a video graphics controller driving a display, and other devices for human oriented I/O may to implement a personal computer, personal computer or smart phone.

Figure 4:
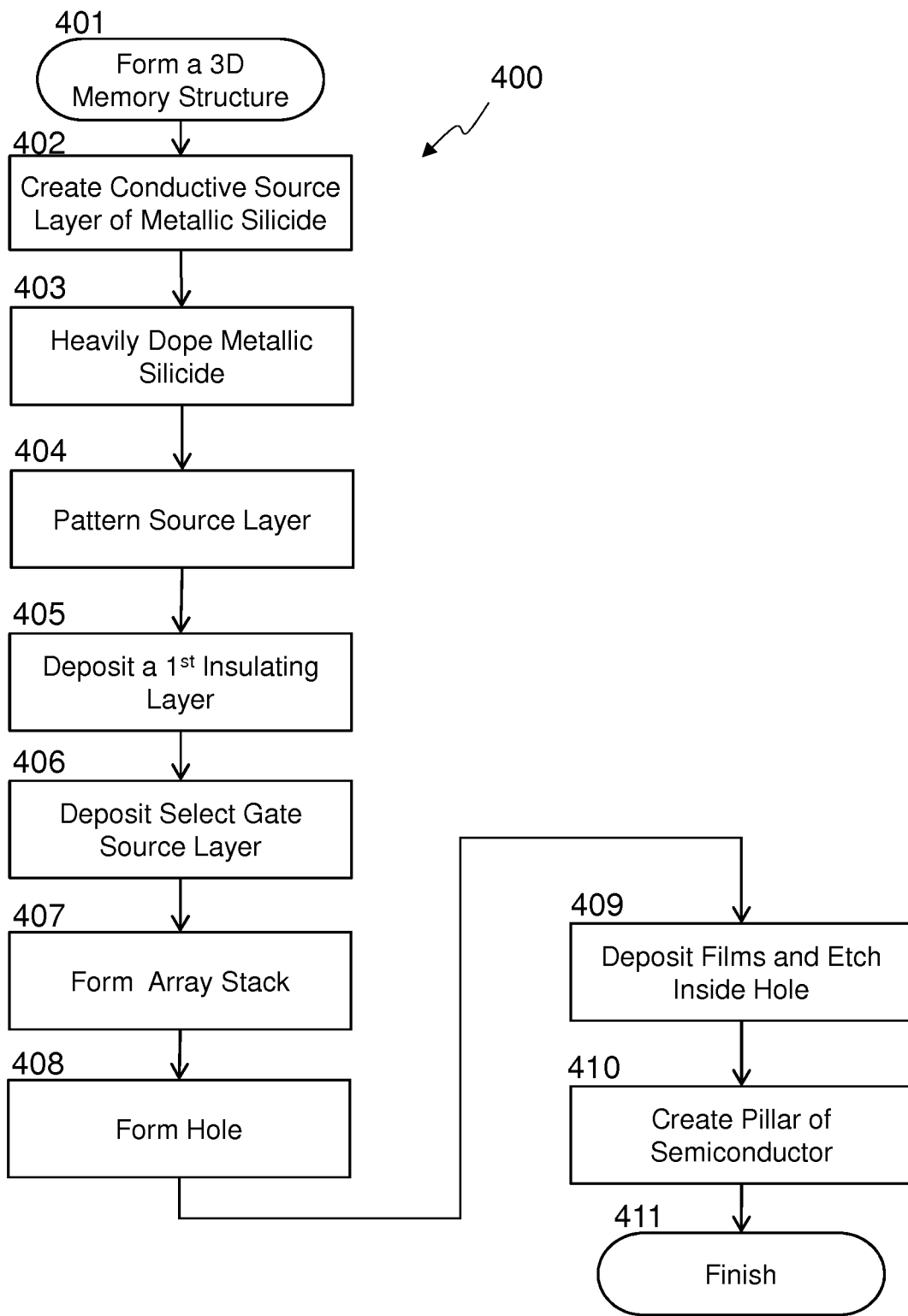
FIG. 4 is a flowchart of an embodiment of a method to fabricate a three dimensional memory structure.

FIG. 4 is a flowchart 400 of an embodiment of a method to fabricate a three dimensional memory structure and FIG. 5A-D show cross sectional side views of various stages of the method shown in FIG. 4. FIG. 4 and FIG. 5A-D are discussed together below.

Flowchart 400 may begin to form a 3D memory structure at block 401 and may create a conductive source layer 502 above a substrate 501 at block 402. As described above, the substrate may include one or more layers and or films of material that may or may not be patterned, before the source layer 502 is created. The conductive source layer 502 may be made of a source material that is conductive and may be suitable for use as an etch stop. The source material may have a slower etch rate than other layers 503-525. In one embodiment, the source line material has an etch rate no faster than about 33% as fast as an etch rate of the insulating material used in the insulating layer 503 for an etch process used to form the hole 531. In other embodiments, the materials in the various layers, including the insulating layer 103, may have an etch rate that is 5, 10 or more times faster than the source material.

In various embodiments, the source material may be a metallic silicide, such as tungsten silicide ($WSi_x$) or other metal-silicon compound. Various formulations of tungsten silicide may be used with any atomic ratio of tungsten to silicon, but in some embodiments, the tungsten silicide may have an atomic ratio of between 1 and 10 atoms of silicon per atom of tungsten. In at least one embodiment, the conductive source layer 502 may be made with tungsten silicide having an atomic ratio of about 3 atoms of silicon per atom of tungsten, such as between about 2.5 and about 3.5.

In some embodiments, the conductive source layer 502 may be doped at block 403. In some embodiments, the conductive source layer 502 may be heavily N-doped. Heavy doping may be defined as a concentration of about $10^{19}$ atoms per $cm^3$ or more. In at least one embodiment, the source layer 502 may be doped with arsenic (As) or phosphorus (P) to a level between about $10^{20}$ atoms per $cm^3$ and about $10^{21}$ atoms per $cm^3$. The doping may be performed by an implant or deposition process with in-situ doping, many of which are well known.

In some embodiments, the conductive source layer 502 may be patterned at block 404 to create various distinct conductors, such as multiple source lines. Patterning may involve multiple processes such as application of a photolithographic material, exposure of the photolithographic material through a mask, and various etching processes, depending on the embodiment.

A first insulating layer 503 may be created above the conductive source layer 502 at block 405. The term "above," as used herein and in the claims, means that, in this example, the conductive source layer 502 is between the substrate 501 and the first insulating layer 503, but although the conductive source layer 502 and the first insulating layer 503 may be in direct contact in some embodiments, other embodiments may include additional layers, films or other material between the conductive source layer 502 and the first insulating layer 503. Creating a layer may be performed by any process or combination of processes, including, but not limited to, deposition of a material, implantation or doping of an existing material, inducing a chemical reaction at the surface of an existing material, or any other process, many of which are well known.

A select gate source layer 511 may be deposited above the first insulating layer 503 at block 406. The select gate source layer 511 might not be patterned to form a channel for the SGS FET, although a control gate of the SGS FET may be patterned in the select gate source layer 511. The select gate source layer 511 may be made of any conductive material but may be made with P-doped polysilicon in at least one embodiment. The first insulating layer 503 may be made of any non-conductive material but may be made with oxides in at least one embodiment.

An array stack 520 may be formed above the select gate source layer 511 at block 407 of the flowchart 400. In some embodiments, the array stack 520 may be formed by creating alternating layers of insulating material 521, 523, 525 and conductive material 522, 524 above the select gate source layer 511 to create the work-in-process (WIP) integrated circuit (IC) 500A in FIG. 5A. In some embodiments, various other layers or films may be included between the alternating insulating layers 521, 523, 525 and conductive layers 522, 524. Patterning and/or etching processes may be performed at various stages during the formation of the array stack 520.

In some embodiments additional layers may be deposited above the array stack 520 before the hole 531 is created. In at least one embodiment, layers for a select gate drain FET may be created, such as a P-doped polysilicon layer for the control gate and one or more layers of an insulator. In some embodiments a top layer of insulating material may be included, such as a nitride, before the hole is formed. The top layer may use a material that can better resist various etching and other processes that may be used in blocks 408-411 of the flowchart 400.

Figure 5A:
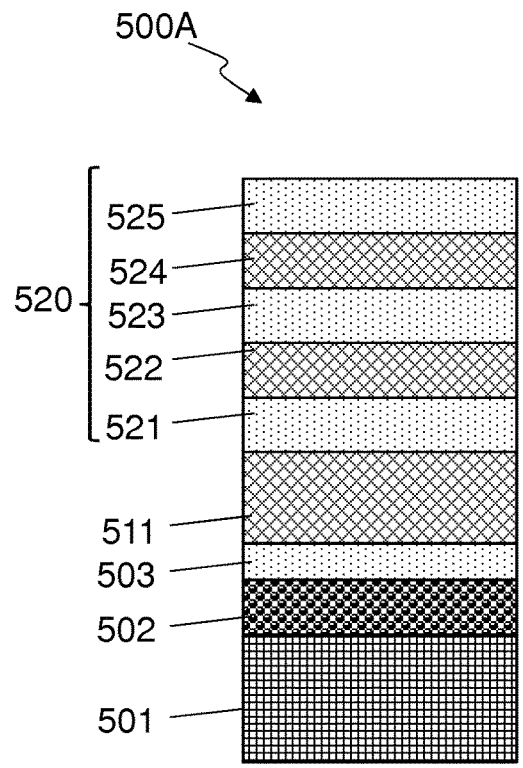
FIG. 5A-D show cross-sectional side views of various stages of the method shown in FIG. 4.
Figure 5B:
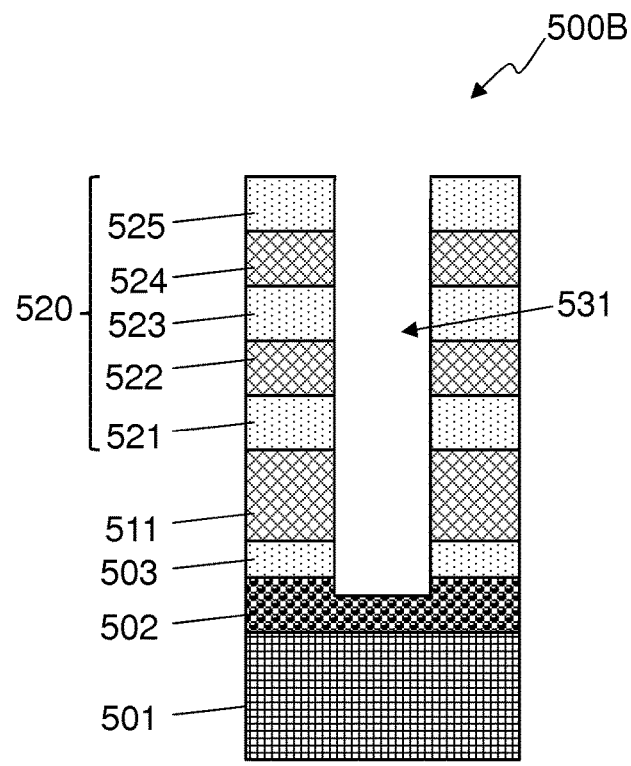
Figure 5C:
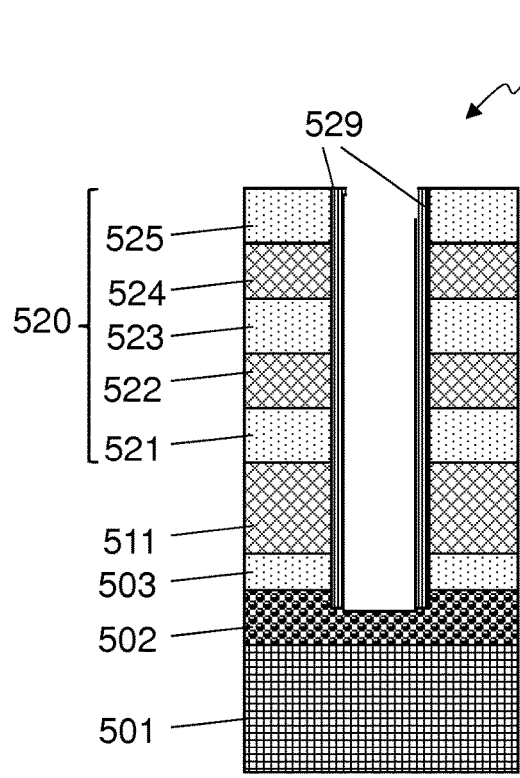

An array channel hole 531 may be formed at block 408, using etching or various other techniques, through the alternating various layers 503-525, and in some embodiments, including the layers for the SGD FET, down to the conductive source layer 502 as shown in WIP IC 500B of FIG. 5B. In some embodiments, the hole 531 may have a very high aspect ratio due to the number of layers etched through. In some embodiments, the hole 531 may have an aspect ratio of 10:1 or greater, meaning that the hole 531 may be at least 10 times as deep as its diameter. Due to the lower etch rate of the material used in the conductive source layer 502, the conductive source layer 502 may act as an etch-stop for the etch used to create the hole 531. In at least one embodiment, a single dry etch process may be used to create the hole 531. Having a source layer 502 with a slow etch rate may allow for a longer etch period to be used to ensure that the hole 531 extends through all the upper layers 503-525 while keeping the hole 531 from punching through the source layer 502 to the substrate 501. The array channel hole 531 may be roughly circular in many embodiments although some embodiments may use other shapes. The hole 531 may extend into the conductive source layer 502 to some extent, but may not extend all the way through the conductive source layer 502 in some embodiments.

One or more films of material 529 may be deposited inside the hole at block 409, which may include etching inside the hole for one or more periods. The depositing and etching may occur after the creation of the hole 531 and before the creation of the pillar 550 of semiconductor material to create the WIP IC 500C of FIG. 5C. The depositing and etching may form charge storage mechanisms in the hole 531 before creating the pillar 550 of semiconductor material, such as a conductive floating gate or a non-conductive charge trapping layer. In one embodiment, an oxide-nitride-oxide (ONO) film may be created in the array stack 520 area and an oxide film to act as a gate oxide may be created in the area of the conductive layer 511 for the SGS FET. In another embodiment, the conductive layers in the array stack may be etched back to create room for polysilicon floating gates, and multiple processes used to create an ONO film between the control gates and the floating gates and an oxide film between the floating gate and the pillar 550.

Figure 5D:
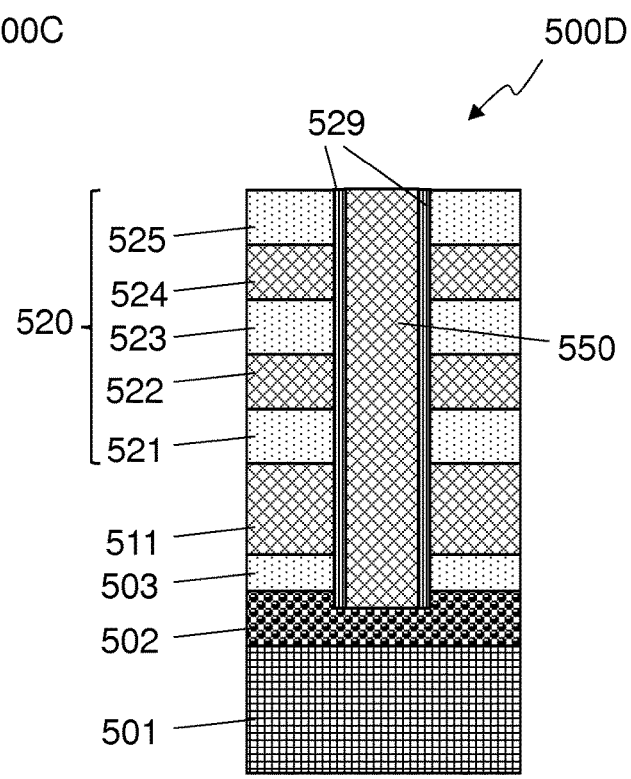

The flowchart 400 may continue at block 410 to create a pillar 550 of semiconductor material in the hole 531 to create the WIP IC 500D of FIG. 5D. The pillar 550 of semiconductor material, which may be made of polysilicon in some embodiments, may be in electrical contact with the conductive source layer 502. In some embodiments, the pillar may be in ohmic contact with the conductive source layer 502. The pillar 550 may be a monolithic volume of semiconductor material that extends through the various layers of the stack of memory cells 520 and SGS FET to connect to the source layer 502. In some embodiments, the pillar 550 may also extend through an SGD FET formed above the stack 520. The flowchart 400 may finish at block 411.

The method shown in FIG. 4 may simplify the process flow and may offer a cost reduction by eliminating process steps as compared to processes that may pattern the select gate before forming the NAND string. The method shown in FIG. 4 may also increase NAND string current by forming a monolithic channel without discontinuity. The method shown in FIG. 4 may also eliminate multiple high temperature processes as compared to traditional methods of forming a vertical NAND string which may pattern the select gate before and after the NAND string.

Examples of various embodiments are described in the following paragraphs:

An example method to fabricate a three dimensional memory structure may include creating a conductive source layer including a source material, creating an insulating layer above the conductive source layer, the insulating layer including a non-conductive material, creating a select gate source layer above the insulating layer, forming an array stack above the select gate source layer, using the conductive source layer as a stop-etch layer to create a hole through the array stack, the select gate source layer, and the first insulating layer, that stops in the conductive source layer, and creating a pillar of semiconductor material in the hole, the pillar of semiconductor material in electrical contact with the conductive source layer, where the source material has an etch rate no faster than 33% as fast as an etch rate of the non-conducting material for an etch process used to create the hole. In some example methods the source material includes a metallic silicide. In some example methods the source material includes tungsten silicide. Some example methods may also include heavily doping the source material with arsenic or phosphorus, where the electrical contact between the pillar of semiconductor material and the conductive source layer includes an ohmic contact. In some example methods the select gate source layer, and the pillar of semiconductor material include polysilicon, and the insulating layer includes silicon oxide. Some example methods may also include creating a select gate drain layer above the array stack before the creation of the hole, where the hole is also created through the select gate drain layer. Some example methods may also include forming charge storage mechanisms in the hole before creating the pillar of semiconductor material, where a charge storage mechanism includes a conductive floating gate or a non-conductive charge trapping layer. Some example methods may also include depositing one or more films inside the hole, and etching inside the hole for one or more periods. In some example methods the creating of the hole is accomplished by a single dry etch process. In some example methods a depth of the hole is at least 10 times as deep as a width of the hole. Some example methods may also include patterning the conductive source layer. Any combination of the examples of this paragraph may be used in embodiments.

An example integrated circuit may include a conductive source line including a source line material, a pillar of semiconductor material extending from the source line in a substantially perpendicular direction, a field effect transistor including a channel and a control gate, where the channel is formed in the pillar of semiconductor material, and the control gate is separated from the source line by an insulating material, and two or more memory cells stacked on the field effect transistor, the two or more memory cells including channels formed in the pillar of semiconductor material, where the source material has an etch rate no faster than 33% as fast as an etch rate of the insulating material. In some example integrated circuits the source line material includes a metallic silicide. In some example integrated circuits the source line material includes tungsten silicide. In some example integrated circuits the tungsten silicide includes between 1 and 10 atoms of silicon per atom of tungsten. In some example integrated circuits the tungsten silicide includes about 3 atoms of silicon per atom of tungsten. In some example integrated circuits the tungsten silicide is heavily doped. In some example integrated circuits the pillar of semiconductor material and the source line are in ohmic contact. In some example integrated circuits the pillar of semiconductor material includes polysilicon. In some example integrated circuits the two or more memory cells may include a field effect transistor having a charge storage mechanism located between a control gate and the pillar of semiconductor material, the charge storage mechanism including a conductive floating gate or a non-conductive charge trapping layer. In some example integrated circuits the two or more memory cells may include at least 16 flash memory cells coupled together into a NAND string, and the field effect transistor is coupled to the NAND string to function as a select gate. Some example integrated circuits may also include a second field effect transistor, positioned above the two or more memory cells, the second field effect transistor including a channel formed in the pillar of semiconductor material, where the two or more memory cells comprise to or more flash memory cells coupled together into a NAND string, and the field effect transistor and the second field effect transistor are coupled to the NAND string, at opposite ends of the NAND string, to function as select gates. Any combination of the examples of this paragraph may be used in embodiments.

An example electronic system may include supervisory circuitry to generate memory control commands, and at least one memory, coupled to the supervisory circuitry, to respond to the memory control commands, the at least one memory including at least one source line including a metallic silicide, two or more vertical NAND flash strings with select gates, a vertical NAND string including insulating layers, conductive layers, and a pillar of semiconductor material extending through the insulating layers and conductive layers, and substantially perpendicular to, and in ohmic contact with, the at least one source line. In some example electronic systems the conductive layers and the pillar of semiconductor material may include polysilicon. In some example electronic systems the metallic silicide includes tungsten silicide. In some example electronic systems the tungsten silicide includes about 3 atoms of silicon per atom of tungsten. Some example electronic systems may also include, I/O circuitry, coupled to the supervisory circuitry, to communicate with an external device. In some example electronic systems the electronic system is a solid state drive. Any combination of the examples of this paragraph may be used in embodiments.

As used in this specification and the appended claims, the singular forms "a", "an", and "the" include plural referents unless the content clearly dictates otherwise. Furthermore, as used in this specification and the appended claims, the term "or" is generally employed in its sense including "and/or" unless the content clearly dictates otherwise. As used herein, the term "coupled" includes direct and indirect connections. Moreover, where first and second devices are coupled, intervening devices including active devices may be located there between.

The description of the various embodiments provided above is illustrative in nature and is not intended to limit this disclosure, its application, or uses. Thus, different variations beyond those described herein are intended to be within the scope of embodiments. Such variations are not to be regarded as a departure from the intended scope of this disclosure. As such, the breadth and scope of the present disclosure should not be limited by the above-described exemplary embodiments, but should be defined only in accordance with the following claims and equivalents thereof.

What is claimed is:

1. A method to fabricate a three dimensional memory structure comprising
    creating a conductive source layer comprising a source material,
    creating an insulating layer above the conductive source layer, the insulating layer comprising an non-conductive material,
    creating a select gate source layer above the insulating layer,
    forming an array stack above the select gate source layer,
    using the conductive source layer as a stop-etch layer to create a hole through the array stack, the select gate source layer, and the first insulating layer, that stops in the conductive source layer, and
    creating a pillar of semiconductor material in the hole, the pillar of semiconductor material in electrical contact with the conductive source layer,
    wherein the source material has an etch rate no faster than 33% as fast as an etch rate of the non-conducting material for an etch process used to create the hole.

2. The method of claim 1, wherein the source material comprises a metallic silicide.

3. The method of claim 1, wherein the source material comprises tungsten silicide.

4. The method of claim 1, further comprising
    heavily doping the source material with arsenic or phosphorus,
    wherein the electrical contact between the pillar of semiconductor material and the conductive source layer comprises an ohmic contact.

5. The method of claim 1, wherein the select gate source layer, and the pillar of semiconductor material comprise polysilicon, and the insulating layer comprises silicon oxide.

6. The method of claim 1, further comprising
    creating a select gate drain layer above the array stack before the creation of the hole,
    wherein the hole is also created through the select gate drain layer.

7. The method of claim 1, further comprising
    forming charge storage mechanisms in the hole before creating the pillar of semiconductor material,
    wherein a charge storage mechanism comprises a conductive floating gate or a non-conductive charge trapping layer.

8. The method of claim 1, further comprising
    depositing one or more films inside the hole, and
    etching inside the hole for one or more periods.

9. The method of claim 1, wherein the creating of the hole is accomplished by a single dry etch process.

10. The method of claim 1, wherein a depth of the hole is at least 10 times as deep as a width of the hole.

11. The method of claim 1, further comprising patterning the conductive source layer.

* * * * *